(12) United States Patent
Trimberger

(10) Patent No.: US 7,254,800 B1
(45) Date of Patent: Aug. 7, 2007

(54) METHODS OF PROVIDING ERROR CORRECTION IN CONFIGURATION BITSTREAMS FOR PROGRAMMABLE LOGIC DEVICES

(75) Inventor: Stephen M. Trimberger, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 351 days.

(21) Appl. No.: 10/787,683

(22) Filed: Feb. 26, 2004

(51) Int. Cl.
G06F 17/50 (2006.01)
H03K 17/693 (2006.01)

(52) U.S. Cl. .......................................... 716/16; 716/4
(58) Field of Classification Search .................... 716/4, 716/16, 5
See application file for complete search history.

(56) References Cited

U.S. PATENT DOCUMENTS

| | | | | |
|---|---|---|---|---|
| 4,336,611 | A * | 6/1982 | Bernhardt et al. | 714/768 |
| 5,457,408 | A * | 10/1995 | Leung | 326/38 |
| 6,366,117 | B1 * | 4/2002 | Pang et al. | 326/38 |
| 6,429,682 | B1 * | 8/2002 | Schultz et al. | 326/41 |
| 6,590,929 | B1 * | 7/2003 | Williams | 375/224 |
| 6,901,502 | B2 * | 5/2005 | Yano et al. | 712/37 |
| 7,073,117 | B1 * | 7/2006 | Ireland et al. | 714/786 |
| 2002/0166091 | A1 * | 11/2002 | Kidorf et al. | 714/752 |
| 2003/0070134 | A1 * | 4/2003 | Ivry | 714/784 |
| 2003/0237038 | A1 * | 12/2003 | Cole et al. | 714/755 |
| 2004/0025105 | A1 * | 2/2004 | Doubler et al. | 714/781 |
| 2004/0034828 | A1 * | 2/2004 | Hocevar | 714/800 |
| 2004/0131058 | A1 * | 7/2004 | Ghiasi | 370/389 |
| 2004/0247238 | A1 * | 12/2004 | Argon et al. | 385/24 |
| 2005/0144584 | A1 * | 6/2005 | Chen et al. | 716/16 |
| 2006/0013118 | A1 * | 1/2006 | Ishida et al. | 369/275.3 |
| 2006/0013333 | A1 * | 1/2006 | Chen | 375/297 |

OTHER PUBLICATIONS

Xilinx, Inc.; "Virtex-II Platform FPGA Handbook"; published in Dec. 2000; available from Xilinx, Inc., 2100 Logic Drive, San Jose, California 95124; pp. 33-75.

Xilinx, Inc.; XAPP151 (v1.6); Virtex Series Configuration Architecture User Guide:; Mar. 24, 2003; available from Xilinx, Inc., 2100 Logic Drive, San Jose, California 95124; pp. 1-45.

U.S. Appl. No. 09/797,138, filed Feb. 28, 2001, Trimberger.

* cited by examiner

*Primary Examiner*—Paul Dinh
*Assistant Examiner*—Suresh Memula
(74) *Attorney, Agent, or Firm*—Lois D. Cartier

(57) ABSTRACT

Methods of providing error correction in configuration bitstreams for programmable logic devices (PLDs). While any error correction method can be used, in one embodiment a Hamming code is applied to instructions in the configuration bitstream, while a product code is applied to configuration data. Thus, the higher overhead required for a Hamming code applies to only a few words in the bitstream. The instructions are corrected on receipt of the word that includes the Hamming code, so the instructions are executed correctly even if a transmission error has occurred. However, configuration data can be stored in the configuration memory without correction. With a product code, the exact location of an erroneous bit is not known until the end of the transmission, when a parity word is received. At this time, the PLD can go back and correct erroneous bits in the configuration data prior to enabling the newly loaded design.

13 Claims, 10 Drawing Sheets

METHODS OF PROVIDING ERROR CORRECTION IN CONFIGURATION BITSTREAMS FOR PROGRAMMABLE LOGIC DEVICES

FIELD OF THE INVENTION

The invention relates to Programmable Logic Devices (PLDs). More particularly, the invention relates to methods of detecting and correcting transmission errors in PLD configuration bitstreams.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., clock management circuits such as delay lock loops (DLLs), block RAM, processors, and so forth).

The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Security of the configuration bitstream is a concern for some FPGA users. While configuration is the process of writing the configuration data to the FPGA, "readback" is the process of reading the configuration data from the configured FPGA. A bitstream read from a previously-configured FPGA could be used to configure other, similar, FPGAs, by persons other than those responsible for the original design. Alternatively, the bitstream could be used for reverse engineering a design, i.e., to obtain sensitive information about the design. Therefore, FPGAs typically include an option for disabling readback of the configuration bitstream, or for allowing readback only once (to allow confirmation that the device was configured properly), and then disabling the readback function. Thus, for most PLDs, bitstreams are safe from piracy (e.g., unauthorized duplication or analysis of the bitstream) once the PLD has been successfully configured.

However, a bitstream can potentially still be copied by an unauthorized person prior to (or during) the loading of the bitstream into the PLD. Both to prevent an intercepted bitstream from being used to configure a PLD, and to prevent reverse engineering of the design from the intercepted bitstream, some PLD providers provide bitstream encryption and decryption. In other words, the data in the bitstream is encrypted in such a way as to make it extremely difficult to extract information about the design implemented by the bitstream. The bitstream is then decrypted by decryption circuitry included in the PLD to regenerate the original (unencrypted) bitstream during the configuration process for the PLD. Without the decryption key, the bitstream cannot be decrypted, and the PLD cannot be successfully configured using the pirated bitstream.

Some currently available FPGAs offer both a CRC (cyclic redundancy check) feature and encryption/decryption capability. The CRC feature checks for transmission errors, while the encryption/decryption feature provides a strong barrier to bitstream piracy. One FPGA providing both CRC and encryption/decryption is the Virtex™-II FPGA available from Xilinx, Inc. The Xilinx Virtex-II FPGA is described in detail in pages 33-75 of the "Virtex-II Platform FPGA Handbook", published in December, 2000 and available from Xilinx, Inc., 2100 Logic Drive, San Jose, Calif. 95124. The encryption/decryption feature of the Virtex-II FPGA is described briefly on page 75, and more fully on pages 307-310, of the same publication. Pages 33-75 and 307-310 of the Virtex-II Platform FPGA Handbook are incorporated herein by reference.

FIG. 1 illustrates a known method of generating a PLD bitstream and configuring a PLD using the bitstream. In FIG. 1, element 101 represents a bitstream implementing a design in a target PLD. The original bitstream includes not only configuration data for the PLD, but also a CRC value that represents the data in the bitstream. The original CRC value is used later in the configuration process to confirm that no errors (e.g., transmission errors or errors due to deliberate tampering) exist in the bitstream finally used to configure the PLD. CRC techniques are well known in the relevant arts.

In step 102, the original bitstream is encrypted using one or more user-supplied encryption keys 103. For example, three 56-bit DES (Data Encryption Standard) keys can be supplied to enable the well-known triple-DES encryption method. This step produces an encrypted bitstream 104. In the encrypted bitstream, the original CRC value can be encrypted or can remain unencrypted.

In step 105, the encrypted bitstream 104 is loaded into the target PLD. The PLD includes decryption circuitry. In addition, the user must supply one or more user-supplied decryption keys, which are typically the same as the encryption keys (i.e., element 103). For example, in a Virtex-II FPGA the decryption keys are loaded into the FPGA via a JTAG port, and the key data is maintained using an external battery. If the external battery fails or is disconnected, the key data is cleared from the key memory.

In step 106, the encrypted bitstream is decrypted by the decryption circuitry using the user-supplied decryption keys, providing a decrypted bitstream 107. The decrypted bitstream 107 is loaded into the PLD, i.e., stored in the configuration memory of the PLD (step 108). However, the PLD is not yet functional, as the power-up sequence has not been initiated.

In step 109, a new CRC value 110 is generated from the decrypted bitstream. In step 111, the original CRC value 112 is extracted from the decrypted bitstream. Thus, the original CRC value 112 represents the bitstream as it should be, and the new CRC value 110 represents the bitstream as actually used to configure the PLD.

Note that the steps illustrated in FIG. 1 are typically pipelined, i.e., several steps are occurring simultaneously on different parts of the bitstream. For example, a first group of bits (a first "bitstream word") can be loaded into the PLD (step 108) while a second group of bits is used to calculate the new CRC value (step 109), and a third group of bits is being decrypted (step 106).

In step 113, the new and original CRC values are compared. If no errors have occurred in transit, the two CRC values should be the same. If the two CRC values match (decision step 114), the startup procedure for the configured PLD is performed (step 115), and the PLD begins to function according to the programmed design. If the new CRC value does not match the original CRC value (decision step 114), the startup process for the PLD is disabled (step 116), and the programmed design never becomes functional. The readback function can also be disabled in this situation. Thus, if the encrypted bitstream is subject to a transmission error (or to deliberate tampering) prior to step 105, the new and original CRC values do not match, and the design can be neither used nor studied.

If desired, a new bitstream download can be manually or automatically initiated (see arrow 117) after the detection of a CRC error. This procedure is commonly followed when CRC errors are assumed to be the result of transmission errors, e.g., when bitstream tampering is not a concern.

In theory, a decryption key could be discovered by using a pirated bitstream to repeatedly configure a PLD. Every possible combination of bits can be tried as the decryption key, until one combination results in a functional, configured PLD. However, since each test requires at least a few milliseconds, and there are typically at least 56 bits in the decryption key, this is a very time-consuming process. Even greater security is provided by using encryption/decryption methods such as the triple-DES method. When three 56-bit keys are used for encryption, as in the triple-DES method, it would take many years of effort to "break the code" for a single design. Therefore, the use of triple-DES encryption/decryption methods (or other highly secure methods) is highly desirable in situations where extreme security is required.

However, no matter what encryption/decryption algorithm is used, the configuration of a PLD with an encrypted bitstream requires the presence of the decryption key. Therefore, if reconfiguration of the PLD is enabled, the decryption key is generally stored in a special key memory in the PLD. In these situations, the configured, functional PLD remains, at least in theory, subject to reconfiguration by a "hostile" bitstream, e.g., by a bitstream created by an unauthorized person attempting to obtain sensitive information about the design.

Therefore, it is desirable to provide methods of detecting unauthorized bitstreams presented to a PLD in an attempt to reconfigure the device, and preventing the use of such bitstreams to obtain sensitive information. It is further desirable to detect and correct transmission errors in PLD configuration bitstreams. It is yet further desirable to differentiate between transmission errors and unauthorized attempts to access sensitive information by altering a configuration bitstream, thereby allowing a single PLD to address both of these two situations.

SUMMARY OF THE INVENTION

A first aspect of the invention provides methods of securing a programmable logic device (PLD) when an intrusion attempt is detected. According to some embodiments, the invention provides methods of erasing sensitive data from the PLD when an attack is detected. According to other embodiments, the invention provides methods of disabling startup and reconfiguration of the PLD when an attack is detected. For example, when an attempt is made to configure the PLD with an unauthorized bitstream, a decryption key stored on the PLD can be erased, or decryption logic in the PLD can be otherwise disabled.

In some embodiments, an incorrect cyclic redundancy check (CRC) value during configuration is interpreted as an attack, while in other embodiments a counter permits a predetermined number of failed configuration attempts before assuming an attack and erasing the sensitive data. In some embodiments, an error correction procedure is performed on the bitstream after receiving the bitstream and before generating a new CRC value. This procedure prevents most transmission errors from being incorrectly interpreted as an attack.

In some embodiments, an attack is assumed when no CRC value is received within a predetermined number of clock cycles after receipt of a configuration bitstream. In other embodiments, an attempt to operate the PLD outside normal operating ranges is interpreted as an attack.

A second aspect of the invention provides methods of providing error correction in configuration bitstreams. These methods can be used, for example, to correct transmission errors while continuing to circumvent unauthorized attacks as described above. While any error correction method can be used, in one embodiment a Hamming code is applied to each instruction in the configuration bitstream, while a product code is applied to configuration data. Thus, the higher overhead required for a Hamming code applies to only a few words in the bitstream. The instructions are corrected on receipt of the word that includes the Hamming code, so the instructions are executed correctly even if a transmission error has occurred. However, configuration data can be stored in the configuration memory without correction. With a product code, the exact location of an erroneous bit is not known until the end of the transmission, when a parity word is received. At this time, the PLD can go back and correct erroneous bits in the configuration data prior to enabling the newly loaded design.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Unencrypted configuration bitstreams are inherently relatively secure, simply because of the complexity of the configuration bitstreams in use today. A configuration bitstream for a modern PLD can include millions of bits. Each bit in the bitstream can, for example, form a portion of a configuration instruction, provide data to be stored in a single configuration memory cell in the PLD, remain unused, form a portion of a CRC value, or serve some other purpose. Identifying the target configuration memory cell, for example, for a single bit in the bitstream is no easy task.

However, when the motivation is strong enough, an unauthorized person might be able to create a "map" showing the correspondence between configuration data bits in the bitstream and either locations or functions in the PLD targeted by the bitstream. Therefore, encrypted bitstreams are often used in sensitive applications. In an encrypted bitstream, there is no one-to-one correspondence between bit values and configuration memory cells, or between bit values and functions within the PLD. The value of each bit in the encrypted bitstream depends on the values of many bits in the unencrypted bitstream. Hence, little or no information can be gained about a design by studying the encrypted bitstream.

Further, altering a single bit in the encrypted bitstream and then loading the bitstream into a PLD causes a CRC error, and the PLD never becomes functional. This is true even if the would-be pirate has somehow obtained the decryption key and loaded the key into the target PLD, or has obtained the use of a PLD that already stores the decryption key (e.g., a PLD already part of a functioning system in which reconfiguration is enabled by the presence of the key).

Therefore, encrypted configuration bitstreams are very secure, particularly when the triple-DES encryption/decryption technique described in the Background section is used. However, even with an encrypted bitstream, it might be possible to obtain information about a PLD design, given sufficient time and motivation, using the method illustrated in FIG. 2. Although implementing this method would require a great deal of both time and resources, in the most sensitive applications it is desirable to remove even the remotest possibility of obtaining sensitive information about a design. The procedure of FIG. 2 requires either the decryption key for the target bitstream or the use of a PLD that already stores the decryption key.

Figure 1:
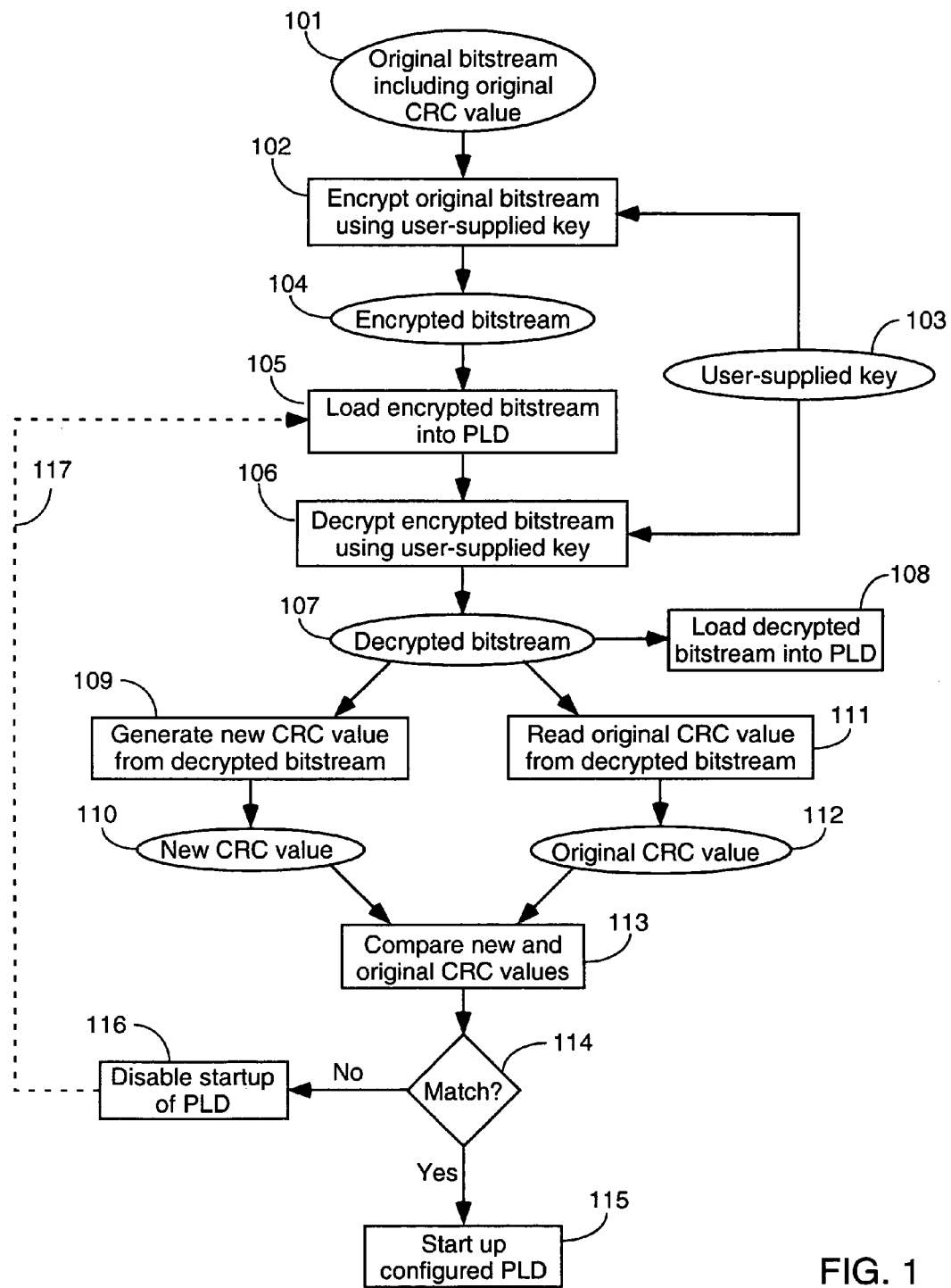
FIG. 1 illustrates the steps of a known method of generating an encrypted PLD bitstream and configuring a PLD using the bitstream.
Figure 2:
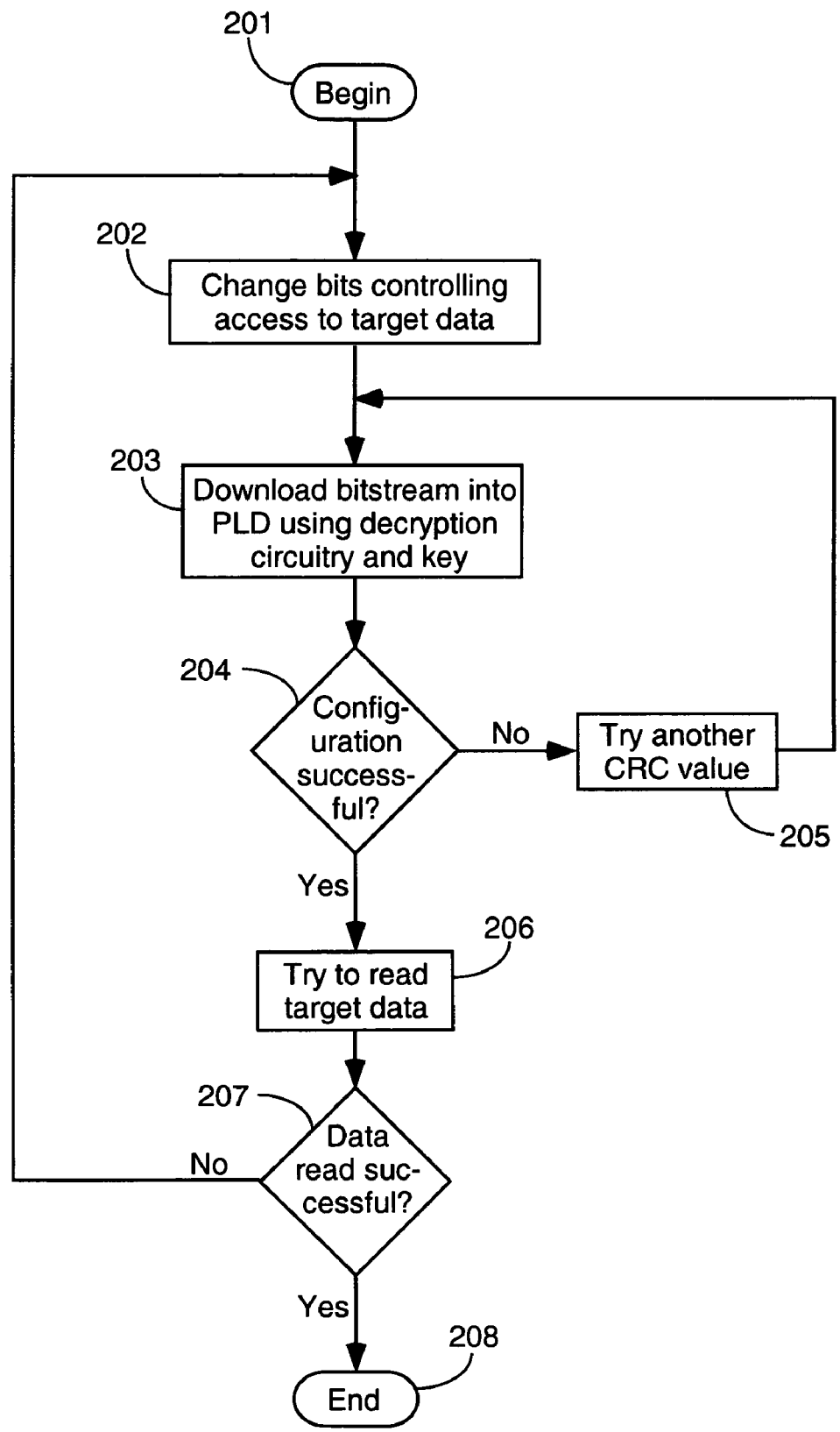
FIG. 2 illustrates the steps of a procedure which, given sufficient time, could potentially be used to obtain sensitive information about the design loaded in FIG. 1.

FIG. 2 illustrates the steps of a procedure which, given sufficient time and resources, could potentially be used to obtain sensitive information about, for example, the design loaded in FIG. 1. Step 201 ("Begin") provides a starting point for the method. In step 202, one or more bits in the configuration bitstream are flipped (i.e., a high value is replaced by a low value, or vice versa). Ideally (from the pirates point of view), flipping these bits would result in localized changes in the design that would permit access to sensitive data within the design. For example, the sensitive data might include data stored in on-board block RAM, and the changes to the design might connect the RAM output terminals to input/output (I/O) pads in the PLD. This particular design alteration, although very difficult to achieve, would make it possible to read the block RAM contents at the I/O pads.

At step 203, the altered bitstream is loaded into the target PLD using the PLD's decryption circuitry and the required decryption key. (The term "target PLD" is used herein to indicate a PLD consistent with the configuration bitstream of interest.) On extremely rare occasions, particularly if the CRC value includes a small number of bits, the altered configuration bitstream might have the same CRC value as the original bitstream. If this is the case (decision step 204), an attempt can be made to read the target data (step 206). For example, the would-be pirate can look for the sensitive RAM data at the aforementioned I/O pads. Of course, the changes made to the encrypted bitstream are unlikely to have made the desired changes to the design. (Although the general vicinity of the target bits in the bitstream might be known, the encryption algorithm ensures that no simple correlation exists between the target bits and the bits of the encrypted bitstream.) If the data is read successfully (e.g., if the RAM data is present at the I/O pads), then the process is complete ("End", 208).

The likelihood of reaching step 208 is very small. Much more likely, for example, is that when the attempt is made to configure the PLD it will be discovered that the CRC value of the altered bitstream is different from that of the original bitstream. However, the location of the CRC value within the bitstream is generally known (e.g., at the end of the bitstream), and a CRC value has a finite number of bits. For example, many existing PLDs have a CRC value that includes 16 bits. Thus, if the configuration step is unsuccessful (step 204), the CRC value in the bitstream can be altered to another of the 2**16 (two to the sixteenth power) possible values (step 205), and the bitstream can be downloaded again to the PLD (step 203) using the new CRC value.

For example, if the original CRC value is sent to the PLD "in the clear" (in unencrypted format), an attacker can modify the original CRC value, iterating through all possible values until the matching CRC value for the modified bitstream is found. If the original CRC value is not available to the attacker (e.g., if the original CRC value is encrypted, or is stored with the decryption key on the PLD), the attacker can modify other bits in the bitstream that do not affect the portion of the design targeted by the attack. These other modified bits will cause the new CRC to change. If sufficient time and resources are available, eventually the correct CRC value will be obtained, and the PLD will configure successfully (step 204). Clearly, the amount of time required to obtain the correct CRC value is greatly affected by the number of bits in the CRC value.

Another major hurdle for the would-be pirate is attempting to come up with an alteration to the encrypted data that will produce the desired internal connections within the PLD. This process would be one of trial and error. For each altered bitstream, the correct CRC value would first have to be found. Then, each successful altered bitstream would have to be tested to see if the desired effect appeared in the design (step 207). If not, a new alteration to the bitstream would be attempted (return to step 202).

In some PLDs, it might be possible to discover a simple alteration to the bitstream that would enable the readback feature. In these PLDs, once this simple alteration was found, the entire decrypted bitstream could be easily obtained. Hence, unauthorized persons might well attempt to locate a modification to the bitstream that would enable readback. Therefore, some PLDs (e.g., the Xilinx Virtex-II FPGAs referenced above) include a feature whereby whenever decryption is enabled, the readback capability is automatically disabled in hardware. Hence, no alteration to an encrypted bitstream can enable readback in these devices. When this protective feature is present, bitstream modifications that could endanger secure data are likely to be much more extensive and much more difficult to discover.

Given the almost random nature of the alterations to the bitstream and the need to try very large numbers of CRC values for each altered bitstream, the probability of success in this endeavor is very low without the investment of large amounts of resources and several years of time. A 16-bit CRC value would typically require tens of thousands of guesses before the correct value is obtained. To successfully guess dozens of bits of configuration data in addition to the CRC value would typically require millions or billions of trials. However, as previously stated, some applications for PLDs are so sensitive that every possible precaution should be taken in the interests of security. Further, performing billions of trials is within the technological capabilities of bitstream pirates today. Therefore, encryption keys are typically 168 bits in length, requiring on the order of 2**168 trials to guess correctly.

Figure 3:
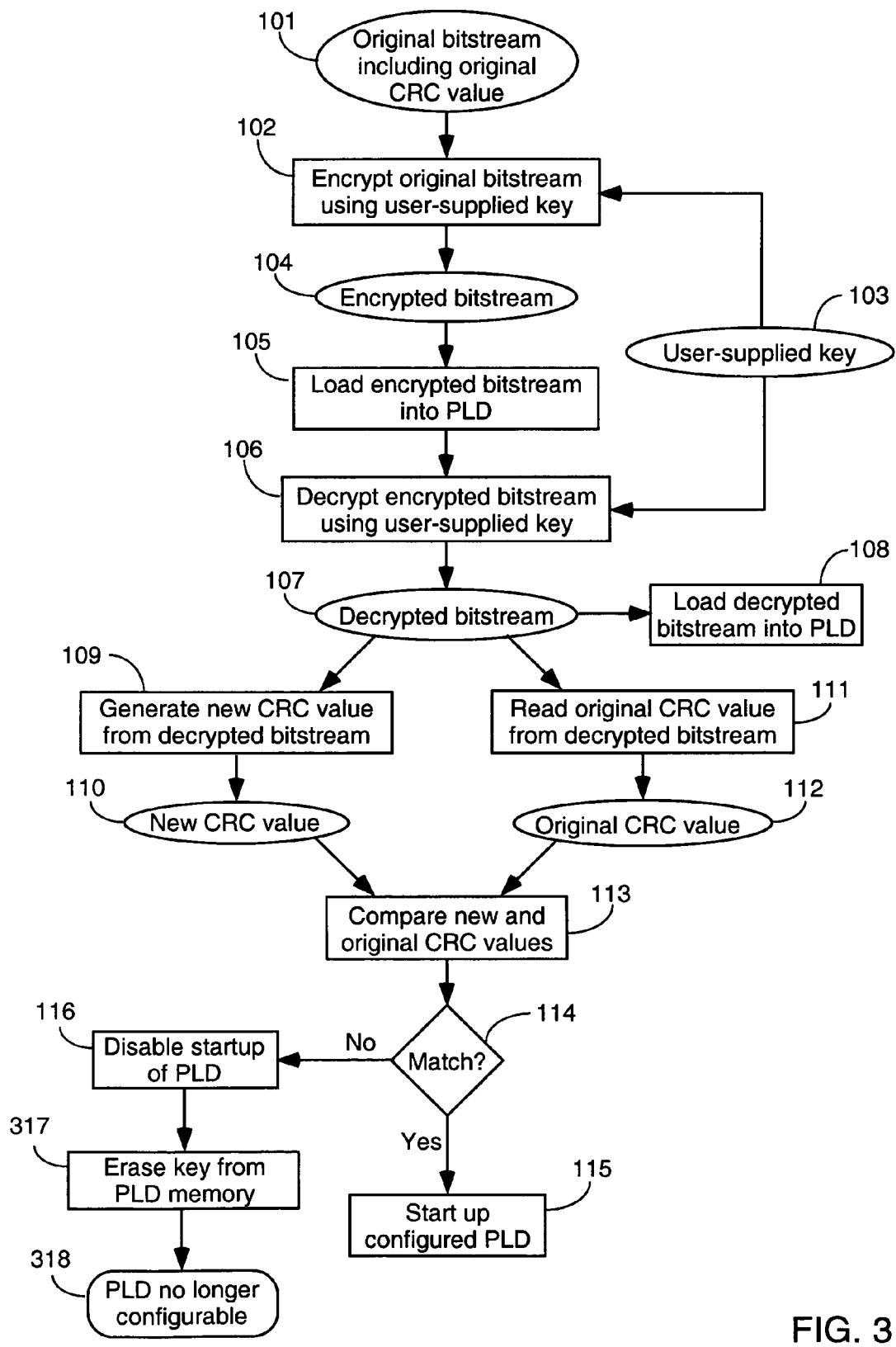
FIG. 3 illustrates the steps of a method of securing a PLD against the procedure illustrated in FIG. 2.

FIG. 3 shows a method of securing a PLD against the procedure illustrated in FIG. 2. Many of the steps of the illustrated method are the same as the steps shown in FIG. 1, as indicated by the unchanged identification numbers in the figure. Most of the unchanged steps are not again described.

The procedure shown in FIG. 3 follows the steps shown in FIG. 1 until step 114, where the new and original CRC values are compared. If the two values match (step 115), the PLD starts up and the design implemented by the decrypted bitstream becomes operational. However, if the two values do not match, the PLD does not start up (step 116). Further, the decryption key is erased from the PLD memory (step 317), preventing any further attempts to configure the PLD (step 318) until the decryption key is reloaded into the PLD. Therefore, if a would-be pirate has obtained a system that includes an operational, reconfigurable PLD, the PLD in the system is altered so that it is no longer reconfigurable without knowledge of the decryption key.

In some embodiments, some or all of the configuration data in the PLD is erased along with the decryption key.

One way in which the decryption key and configuration data might be erased is by reusing existing circuitry that already erases these data. For example, the aforementioned Virtex-II devices include an internal oscillator that is used to clear the decryption key and configuration data when the device enters "key access mode" (e.g., prior to loading a decryption key). A straightforward method of erasing the decryption key and configuration data is to place the device into key access mode whenever an attack is detected.

Figure 4:
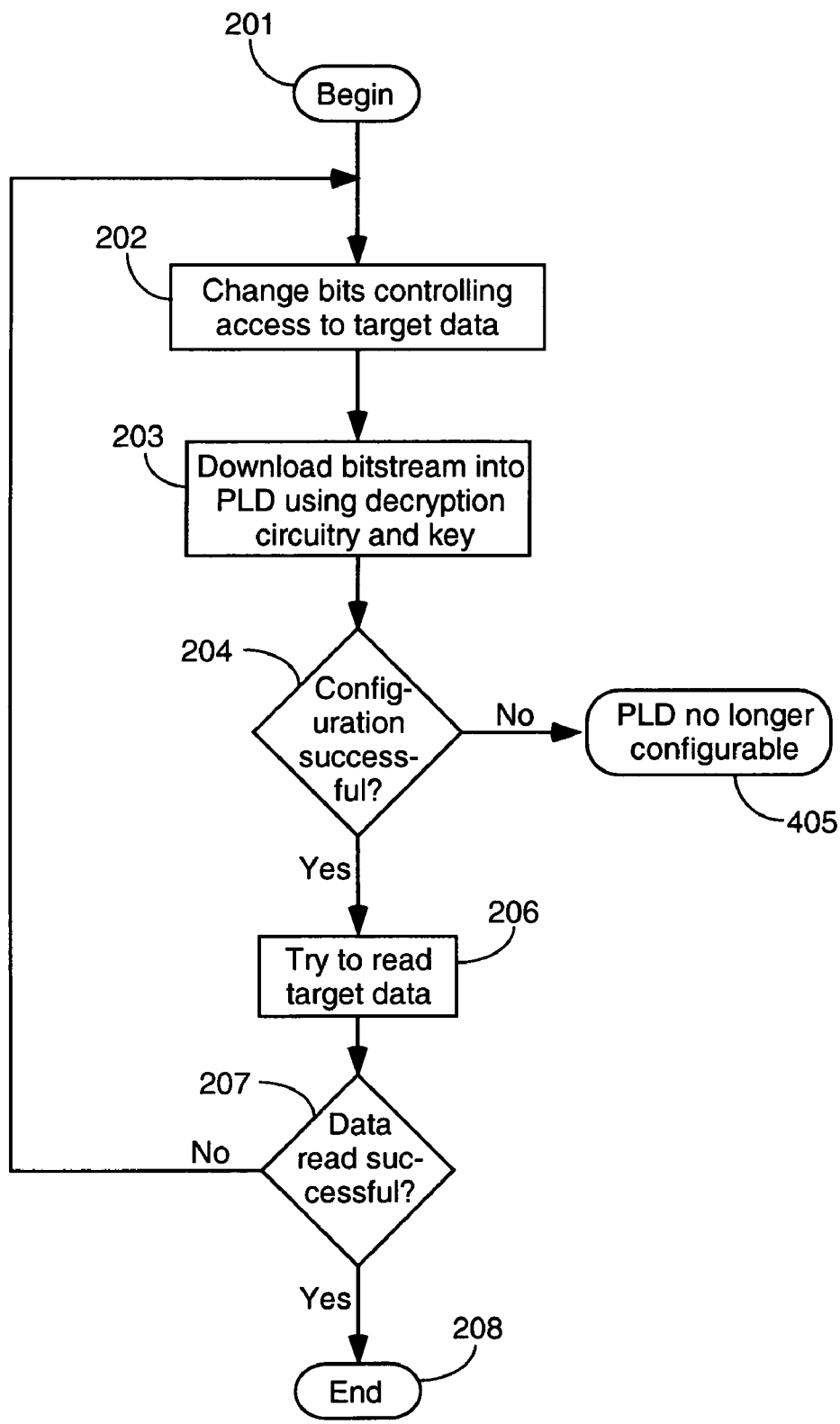
FIG. 4 illustrates the results when an attempt is made to use the procedure of FIG. 2 against a PLD secured as shown in FIG. 3.

FIG. 4 is a counterpart diagram to FIG. 2, illustrating the results if the procedure of FIG. 2 is applied to a PLD secured as shown in FIG. 3. Many of the steps of the illustrated method are the same as the steps shown in FIG. 2, as indicated by the unchanged identification numbers in the figure. Note that at step 204, when the configuration of the PLD is unsuccessful, it no longer makes sense to try another CRC value (step 205 in FIG. 2) in another attempt to reconfigure the PLD. The PLD is no longer configurable (step 405). Any repeated attempt to download the bitstream will always fail, because (for example) the decryption key has been erased from the PLD memory (see step 317 of FIG. 3).

To successfully configure the PLD with an unauthorized bitstream, it would be necessary to guess correctly on the first attempt not only what change to the bitstream is necessary to achieve the desired purpose, but also what CRC value will enable the configuration of the device. To have any chance of configuring the PLD with a modified bitstream would require access to the decryption key, or access to another system including another operational, reconfigurable PLD storing the decryption key. Clearly, if an attacker were required to purchase millions or billions of systems in an attempt to pirate the bitstream, launching the attack using the described methods would be completely impractical. Therefore, the method of FIG. 3 provides a very high level of security.

Figure 5:
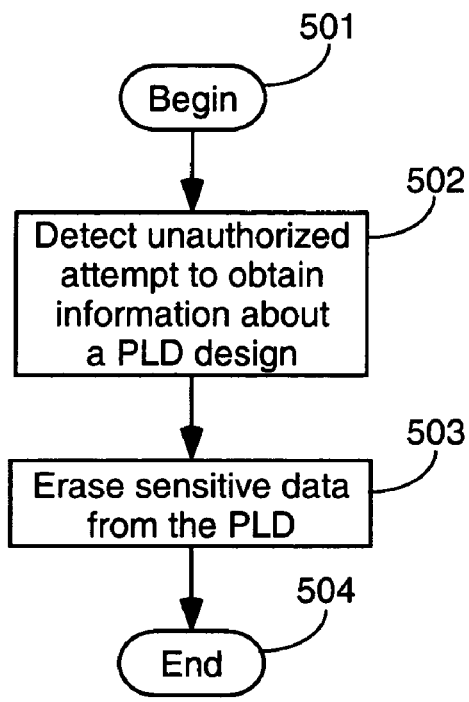
FIG. 5 illustrates the steps of a method of securing a PLD against an attempt to obtain information about a PLD design.

FIG. 5 illustrates the broader concept behind the exemplary method of FIG. 3. Element 501 provides a starting point for the illustrated process. In step 502, an unauthorized attempt to obtain information about a PLD design (an "attack") is detected. The attack can be detected in various ways. For example, in the method of FIG. 3 an attack is assumed whenever a new CRC value derived from the decrypted bitstream does not match an original CRC value supplied to the PLD along with (or as part of) the encrypted bitstream. In other embodiments, an attack is assumed whenever an encrypted bitstream is received, but no CRC value is supplied. For example, a counter in the PLD can count a predetermined number of clock cycles (e.g., 1000 clock cycles) after receipt of the encrypted bitstream. An internal oscillator can be used, for example, to generate the clock signal. When the counter reaches the predetermined number without a CRC being received, an attack is assumed to be in progress.

In other embodiments, a single erroneous CRC value is not considered sufficient evidence of an attack. For example, a transmission error can cause the receipt of an erroneous CRC value. Therefore, in some embodiments, a failed-bitstream counter keeps track of the number of failed attempts to load a configuration bitstream. Only after a predetermined number of failed attempts is an attack presumed to be taking place. This approach is similar in some respects to the well-known approach taken at automatic teller machines (ATMs), for example, which allow the entry of several incorrect personal identification numbers (PINs) before retaining an ATM card. In some embodiments, a setting in the PLD memory (e.g., memory powered by a battery backup or non-volatile memory) is used to store a maximum allowable number N of failed bitstreams. In some embodiments, the number of permitted failed attempts can optionally be set to a value of "unlimited", which setting can be used in non-sensitive applications.

Embodiments allowing multiple configuration attempts, however, can provide less security than some other embodiments, because the counter could probably be reset simply by cycling power to the PLD. For example, if a third failed attempt erases the decryption key, an attacker could make two attempts, cycle power to clear the failed-bitstream counter, and then try again. However, if cycling the power to the failed-bitstream counter also erases the decryption key and the configuration data, this objection is overcome.

In some embodiments, the count of failed attempts is stored in a non-volatile memory on the PLD, along with the decryption key. In these embodiments, the PLD can track break-in attempts even when the power is shut down and restored. In one PLD with one-time-programmable memory, the PLD programs one memory cell each time a failed attempt is detected. In another embodiment, attacks are tracked probabilistically, by programming a non-volatile memory cell with a probability of 25% (for example) for every failed attack. When the last memory cell available for failed-bitstream programming has been programmed, the PLD clears the decryption key from the PLD memory.

In some embodiments, an attack is assumed whenever multiple bit errors are found in widely-separated parts of the bitstream.

In other embodiments, an attack is assumed whenever an attempt is detected to operate the PLD outside normal operating ranges for the PLD. For example, over-temperature operation, under-temperature operation, an abnormally slow internal clock, abnormal variations in the power supply voltage, power near or exceeding the allowable limits, and a variable internal clock could be detected and interpreted as an attack. Each of these conditions is sometimes used to conduct attacks on presently-available FPGAs, for example.

Returning now to FIG. 5, in step 503, sensitive data is erased from the PLD whenever an attack has been detected. The erased data might or might not be the same as the sensitive data that was targeted by the attack. The erased data can include, of course, the decryption key and/or the configuration data. However, other types of data can also be erased, instead of or in addition to these data. For example, only data stored in on-board block RAM could be erased.

Element 504 provides an end point for the process of FIG. 5. Once the sensitive data has been erased from the PLD, further attempts to obtain the data from the PLD are obviously pointless.

Figure 6:
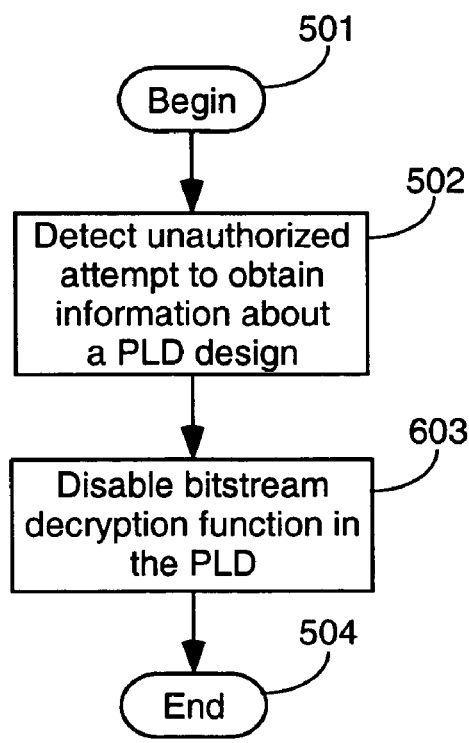
FIG. 6 illustrates the steps of another method of securing a PLD against an attempt to obtain information about a PLD design.

FIG. 6 illustrates another general method of providing security for designs implemented in a PLD. The method of FIG. 6 is similar to the method of FIG. 5, except for the action taken when an attack is detected. In step 603, when an attack is detected, the decryption function in the PLD is disabled. This disablement can be achieved in various ways. One way is by erasing the decryption key, as previously described. Another way is simply by disabling the decryption circuitry in hardware. The PLD can be designed, for example, not to allow the re-enablement of the decryption circuitry except by loading a special key or supplying a special enablement command. In some extreme embodiments, the decryption circuitry is permanently disabled when an attack is detected.

Figure 7:
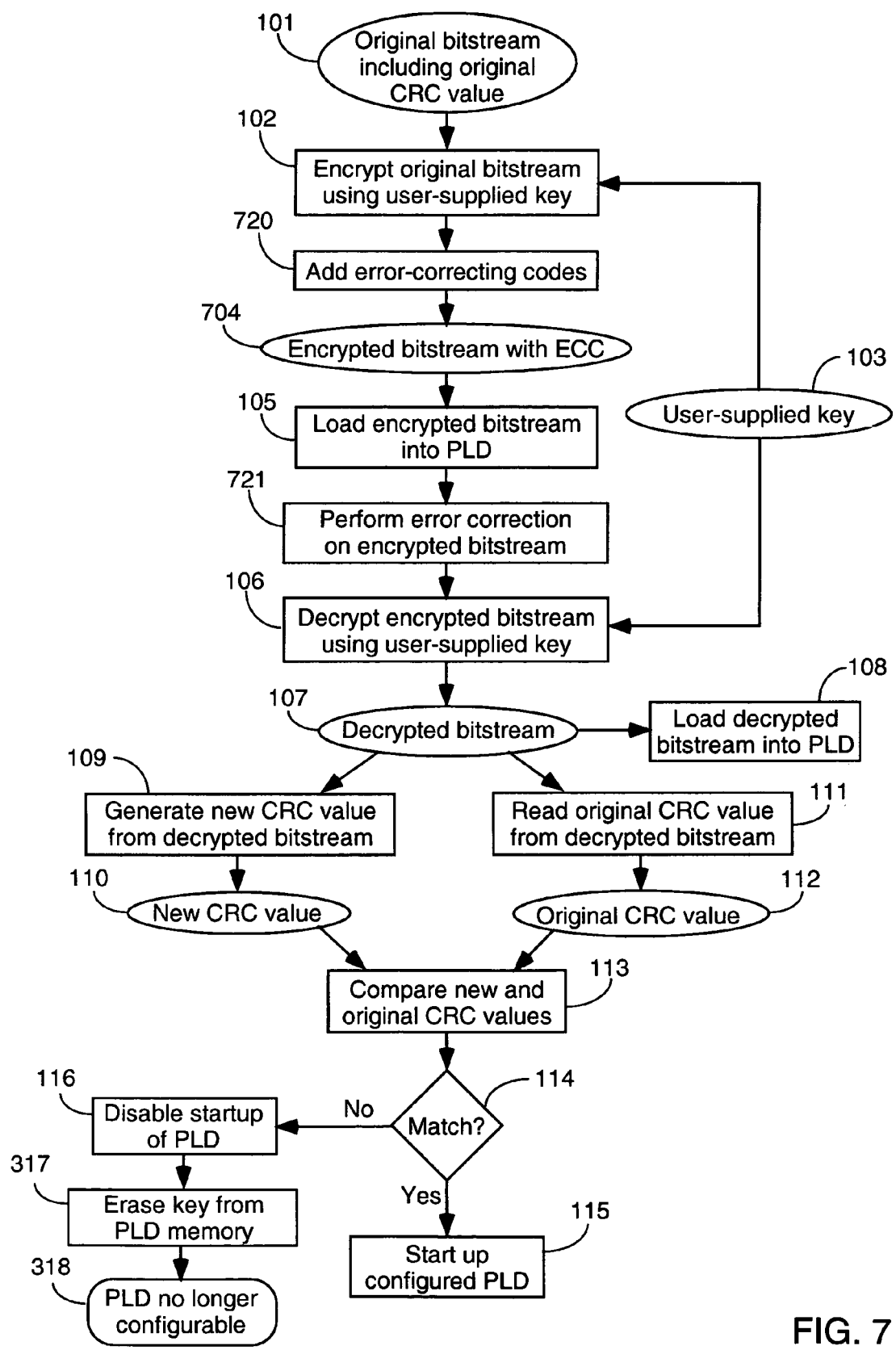
FIG. 7 illustrates the steps of a method of securing a PLD against the procedure illustrated in FIG. 2, while accommodating transmission errors in the bitstream.
Figure 8:
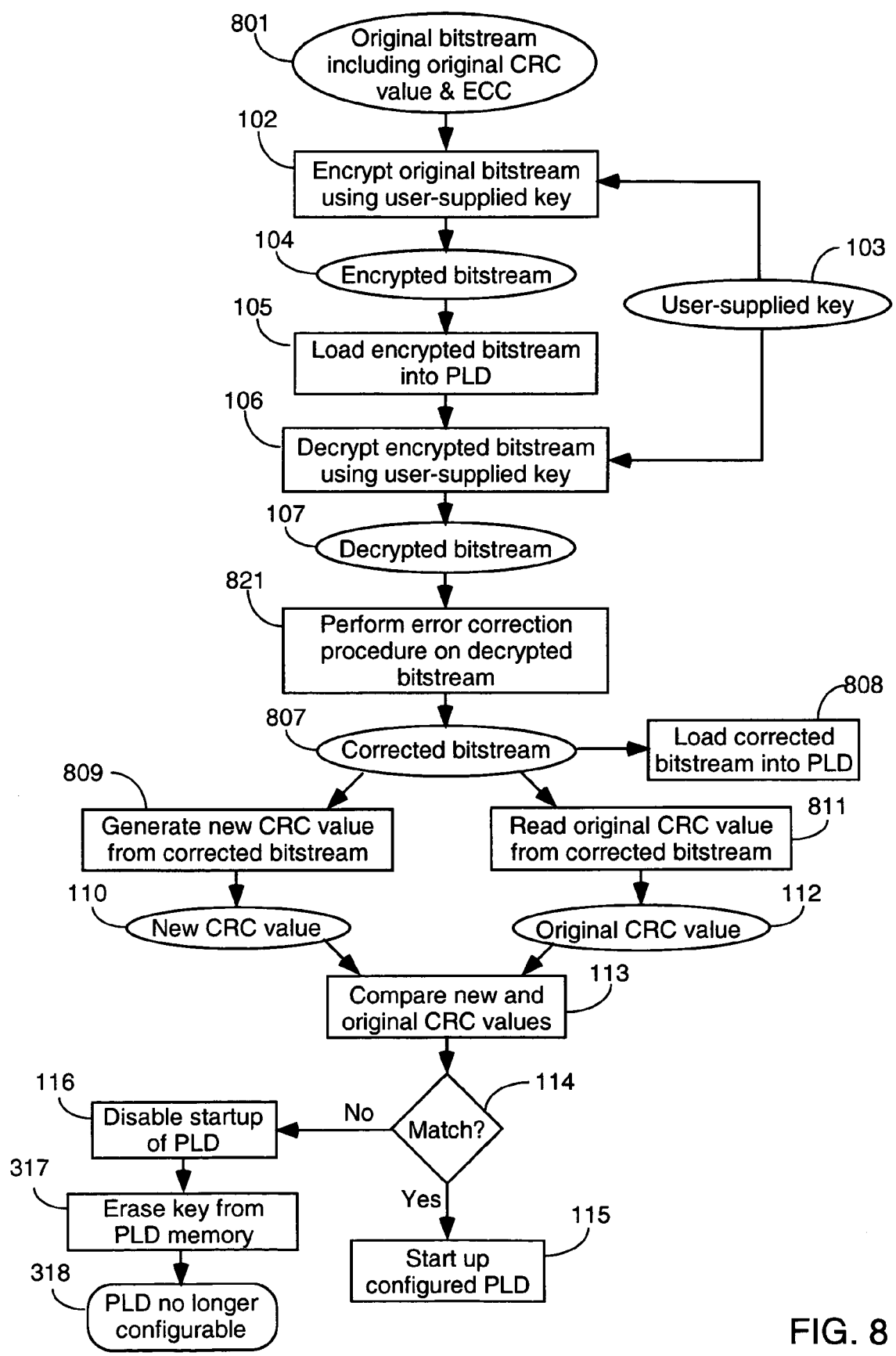
FIG. 8 illustrates the steps of another method of securing a PLD against the procedure illustrated in FIG. 2, while accommodating transmission errors in the bitstream.

As previously mentioned with respect to FIG. 5, in some embodiments a single erroneous CRC value is not considered sufficient evidence of an attack, because a transmission error can cause the receipt of an erroneous CRC value. As proposed above, one solution to this problem is to allow a predetermined number of erroneous bitstreams before deciding that an attack is in progress. Another solution is to perform an error-correction procedure on the bitstream that will correct for transmission errors, and then to classify just one CRC error as an attack. FIGS. 7 and 8 show two different methods that utilize this approach.

The method illustrated in FIG. 7 is similar to the method of FIG. 3, as indicated by the unchanged identification numbers attached to some elements in the figure. However, error correcting codes (ECC) are added to the bitstream after encryption (step 720). Thus, the encrypted bitstream (element 704) includes the error codes. The encrypted bitstream is loaded into the PLD (step 105), and error correction is performed on the encrypted bitstream (step 721) prior to decryption of the bitstream (step 106). The error correction procedure reverses any bit flips caused by transmission errors, assuming a relatively small number of transmission errors compared to the size of the bitstream. Thus, an erroneous CRC comparison result can reasonably be presumed to be an attack.

The method illustrated in FIG. 8 is similar to that of FIG. 7, except that the error correction is performed on the decrypted bitstream. The original bitstream 801 includes both the original CRC value and the error correcting codes. The original bitstream is then encrypted (step 102), loaded into the PLD (step 105), and decrypted using the user-supplied key (step 106), as in FIG. 3, for example. However, an error correction procedure is then performed on the decrypted bitstream (step 821) using the error correcting codes included in the original bitstream. The corrected bitstream 807 is then loaded into the PLD (step 808) and is also used to generate the new CRC value (step 809). The original CRC value is also read from the corrected bitstream (step 811). Thus, if a transmission error has flipped one or more bits in the original CRC value, this error is corrected as well.

Various methods of error correction can be used to insert ECC codes into the bitstream, and to perform the error correction procedure as shown, for example, in step 721 (FIG. 7) or step 821 (FIG. 8). Any known ECC method can be used. Further, the error correction procedure can be performed on either the encrypted bitstream (as in FIG. 7) or the decrypted bitstream (as in FIG. 8). In some embodiments, error correction is performed on the entire bitstream. In other embodiments, error correction is performed only on certain portions of the bitstream. In some embodiments, different error correction procedures are applied to different portions of the bitstream.

Note that the use of error correcting codes is consistent with the above-described methods of detecting and circumventing unauthorized attacks. An error correcting procedure typically detects and corrects single-bit flips within a group of bits (e.g., within a bitstream word). After error correction has been applied, the bitstream is the same as it was prior to the bit flip. If a would-be pirate flips a single bit in the bitstream in an attempt to obtain sensitive information about the design, the ECC procedure simply corrects the bit to its original value, and the resulting design is unchanged. No sensitive information can be derived by following this procedure. However, changes to the bitstream that are not corrected by the ECC procedure (e.g., multi-bit flips in some ECC procedures) are still interpreted as attacks.

To perform error correction on a configuration bitstream, one option is to treat the PLD bitstream like any other transmitted data. For example, desirable characteristics of the selected error correcting code include low overhead (i.e., only a small increase in the number of bits in the bitstream) and the ability to correct the types of transmission errors most likely to occur in PLD bitstreams, such as single-bit errors as opposed to multi-bit errors. One code possessing these characteristics might be, for example, a "product code". In a product code, the data can be thought of as composed of an JxK array of bits (J words of K bits each). In a simple product code, parity is computed on each word, generating a new word of K+1 bits. A cumulative word-wise parity is then calculated using the new Jx(K+1) array, producing one extra parity word that is the exclusive OR function (XOR) of all of the modified words. Therefore, the overhead is one bit per word plus one additional word, or J+(K+1). Assuming a very large number of 32-bit words, for example, the overhead is about $\frac{1}{32}$, or about 3 percent.

When a product code is used, if a one-bit transmission error occurs, the error is detected and identified as an error using the parity bit at the end of the word in which the erroneous bit resides. The bit position of the parity word (added to the end of the bitstream) is also flipped. Therefore, it is clear which bit is in error, and the erroneous bit is easily corrected by flipping the value of the bit.

The drawback of applying the product code method to PLD bitstreams is that a bitstream includes not just data, but also instructions. When the product code method is used, errors are not corrected until after the parity word at the end of the data stream has been received. When the bitstream includes instructions as to how subsequent words in the bitstream are to be interpreted, how many subsequent words are affected by an instruction, and/or where and when the data is to be stored, as in modern PLDs, these instructions are followed on receipt, e.g., before the error correction has been applied. Thus, errors in the instruction word can cause configuration errors even when product code error correction is applied to the bitstream.

For example, if an instruction means "store this number of subsequent data words in configuration memory at this address", and one of the bits comprising the instruction is in error, the configuration data will not be stored, or will be stored incorrectly. Storing the entire bitstream somewhere in the PLD, and then running the error correction procedure on the bitstream prior to loading the data into configuration memory, would overcome this drawback. However, this is not really a practical option. Not only does the amount of data in the bitstream typically vary (with an indicator of the amount of data being included in the bitstream), but temporarily storing a bitstream potentially including several million bits would require an impracticably large amount of additional on-chip memory.

Another option is to encode each word in the configuration bitstream using its own error correcting code, e.g., a Hamming code. Hamming error correcting codes are well-known in the relevant arts. The use of Hamming codes makes error correction in PLD bitstreams a relatively simple matter. However, the overhead is high. A standard Hamming code contains log(i)+1 bits, where "i" is the total number of bits in each coded word (including the Hamming code). Therefore, a 32-bit word including a Hamming code typically includes six bits of ECC, giving an overhead value of about $6/32$, or 19%.

However, note that this type of error coverage is much more valuable when applied to instruction words in the bitstream than when applied to configuration data words. If an error occurs in a configuration data word, the PLD can read back the errant configuration frame and flip the erroneous bit. Therefore, a combined error correction scheme can be implemented in which a Hamming code is used on instruction words, which need to be corrected "on the fly", and a separate product code is used on configuration data words.

For efficiency, the configuration data word size can be made equal to the configuration frame size for the PLD. This approach simplifies the error correction procedure, as described below. The instruction words can be the same size as the configuration data words, or a different size. If the product code correction scheme is not applied to the instruction words, as in some embodiments, there is no need to make the instruction words the same size as the configuration data words.

The combined Hamming/product code method can be implemented as follows, for example. A Hamming code is added to each instruction word in the bitstream. Each instruction word is typically followed by a string of many configuration data words. One parity bit is added to each configuration data word in the string, i.e., per configuration frame, as described above in relation to the product code error correction method. Thus, a one-bit error in a configuration data word shows up immediately in the parity bit for that word. However, it is not known which bit in the word is incorrect until the final parity word (at the end of the string) is received. Therefore, when an erroneous word is detected during configuration, the address of the corresponding configuration frame is stored. When the parity word is received, the location of the erroneous bit within the configuration frame is determined and the erroneous bit is flipped at the previously stored address. For example, the configuration frame can be read from the stored address and exclusive ORed (XORed) with the parity word (assuming even parity), and the altered frame of data can be written back into the configuration memory at the same address.

In some embodiments, the bitstream is divided into two or more streams of data, e.g., each preceded by an instruction word and followed by a parity word. For example, a bitstream can include many different blocks of data, with instructions that they be treated in different ways (i.e., write to a single address, write to several addresses (multi-frame write), and so forth). For example, a bitstream might include an instruction to write to the frame data register (FDR) of the PLD, where the instruction includes a LENGTH value, and follow the instruction word with a long string of configuration data words. The length of the string corresponds to the LENGTH value previously specified. A bitstream can include several such commands. In this example, each portion of the bitstream that includes an instruction to write to the FDR and the configuration data to be written can have its own parity word. (For additional information on FDRs and instructions included in configuration bitstream, see, for example, the "Virtex Series Configuration Architecture User Guide, XAPP151 v1.6", published Mar. 24, 2003 by Xilinx, Inc., which is incorporated herein by reference.)

In a PLD having a configuration frame of 1312 bits, for example, the overhead of the "mixed mode" or "two tier" error correcting code described above is about $1/1312$ (less than 0.1%), because the bitstream consists mostly of data rather than instructions. Nevertheless, the critical transmission errors (e.g., the instruction errors) are corrected immediately on receipt by the PLD, and the less critical errors (e.g., the data errors) can be corrected after receipt of the parity frame, as described above.

In some embodiments, the ECC overhead is reduced even further. A typical instruction word size in a PLD bitstream is 32 bits. However, instructions often do not require 32 bits, so some of these bits are unused. These unused bits can be used to store an error code, e.g., a Hamming code for the instruction word. For example, a 32-bit instruction word could include 27 bits providing the information relevant to the instruction, and a 5-bit Hamming code. In some embodiments the Hamming code is accommodated in instruction words by reducing the number of bits available for the LENGTH value.

Figure 9:
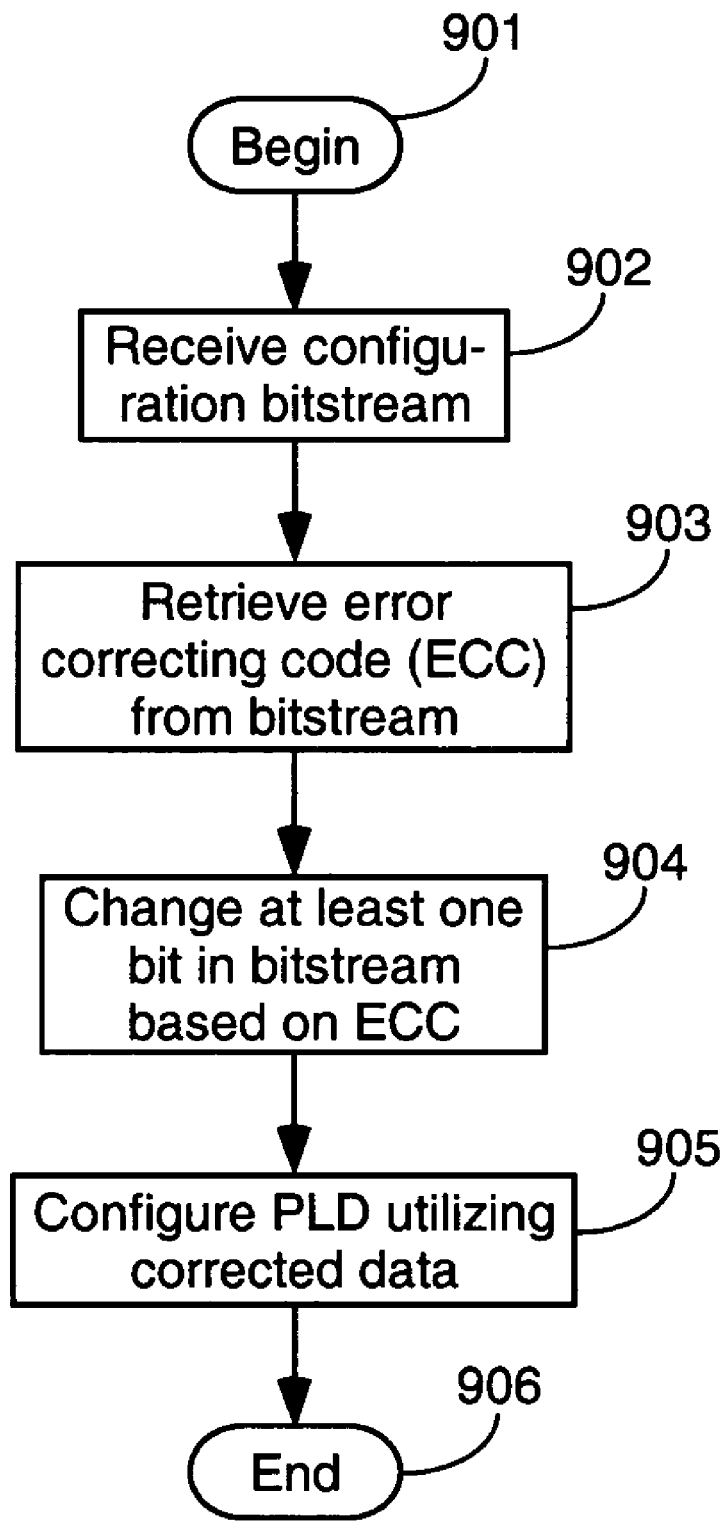
FIG. 9 illustrates the steps of a first method of detecting and correcting a transmission error in a configuration bitstream that can be used, for example, in the methods of FIGS. 7 and 8.

FIG. 9 illustrates the steps of a first method of detecting and correcting a transmission error in a configuration bitstream that can be used, for example, in the methods of FIGS. 7 and 8. Element 901 ("Begin") provides a starting point for the method. In step 902, a configuration bitstream is received, e.g., at a configuration port of a PLD. In step 903, an error correcting code (ECC) is retrieved from the bitstream. This ECC can be, for example, a Hamming code or a product code. However, other types of error correcting codes can also be used. In step 904, the value of at least one bit in the configuration bitstream is corrected based on the ECC retrieved in step 903. The corrected data can be, for example, an instruction word or a configuration data word. In step 905, the corrected data is used to configure the PLD. The method ends at element 906.

In some embodiments, the bitstream includes a string of bitstream words, and in step 904 an erroneous bit in one bitstream word is corrected prior to receipt of a following bitstream word. This approach is particularly helpful when the erroneous word is an instruction word including instructions directing action to be taken in regard to the next word or words in the bitstream. In some embodiments, the erroneous bit is not corrected until after the entire bitstream is received by the PLD. This approach might apply, for example, in embodiments in which a single product code is applied to the entire bitstream.

In some embodiments, the bitstream received in step 902 is encrypted. Therefore, the bitstream must be decrypted prior to configuring the PLD in step 905. This decryption step can be performed either before or after the error correction procedure, as shown (for example) in FIGS. 7 and 8.

Figure 10:
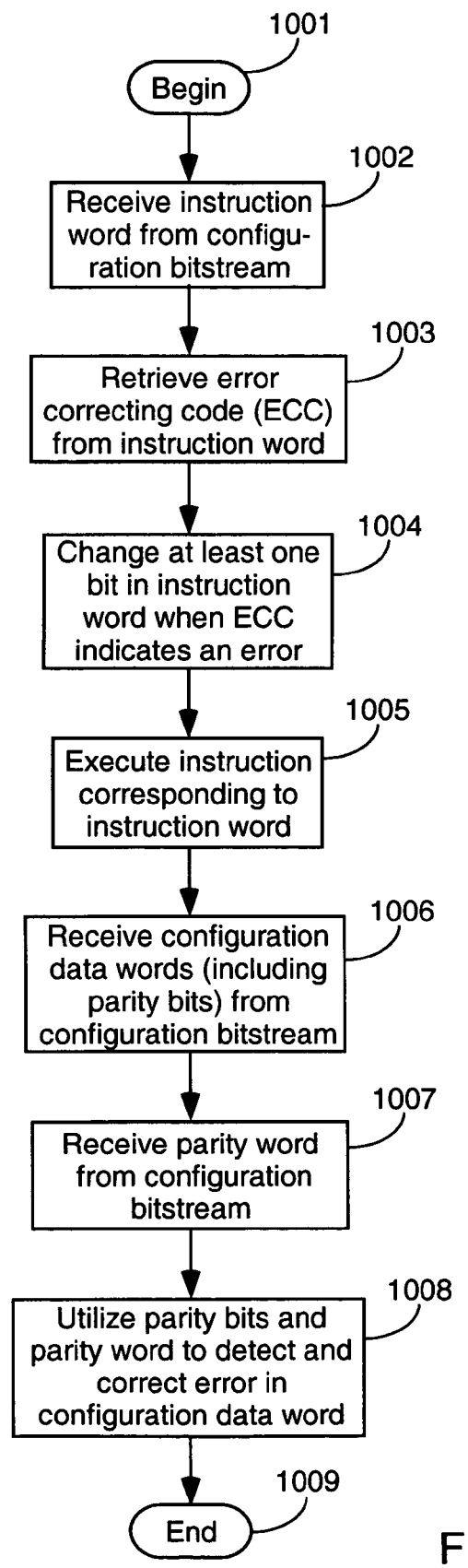
FIG. 10 illustrates the steps of a second method of detecting and correcting a transmission error in a configuration bitstream that can be used, for example, in the methods of FIGS. 7 and 8.

FIG. 10 illustrates the steps of a second method of detecting and correcting a transmission error in a configuration bitstream that can be used, for example, in the methods of FIGS. 7 and 8. The configuration bitstream includes at least one instruction word and two or more configuration data words.

Element 1001 ("Begin") provides a starting point for the method. In step 1002, an instruction word from the configuration bitstream is received, e.g., at a configuration port of a PLD. In step 1003, an error correcting code (ECC) is retrieved from the instruction word. This ECC can be, for example, a Hamming code. However, other types of error correcting codes can also be used. In step 1004, the value of at least one bit in the instruction word is corrected based on the ECC retrieved in step 1003. In step 1005, the instruction corresponding to the corrected instruction word is executed.

Optionally, a different kind of error correcting code can be included in the bitstream for the configuration data words, as shown in FIG. 10. Thus, at step 1006 two or more configuration data words from the configuration bitstream are received, e.g., at the same PLD configuration port. Each configuration data word includes a parity bit. In some embodiments, each configuration data word is the same size as a configuration frame for the PLD. In step 1007, a parity word from the configuration bitstream is also received. In step 1008 the parity word and the parity bits are utilized to detect and correct an error in one of the configuration data words, e.g., as described above with regard to product codes. The method of FIG. 10 ends at element 1009.

Figure 11:
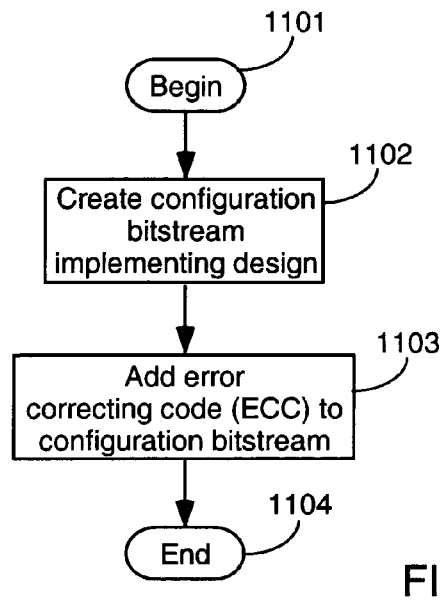
FIG. 11 illustrates a method of generating a configuration bitstream that provides error correction.

FIG. 11 illustrates a method of generating a configuration bitstream that provides error correction. This method can be used, for example, to implement step 720 in FIG. 7, or to generate bitstream 801 in FIG. 8.

Element 1101 ("Begin") provides a starting point for the method. In step 1102, a configuration bitstream is generated that implements a design in the PLD. If desired, this bitstream can include a CRC value (as in bitstream 101 of FIG. 7, for example). In step 1103, an error correcting code (ECC) is added to the configuration bitstream. The method of FIG. 11 ends at element 1104.

The error correcting code added in step 1103 can be, for example, a Hamming code or a product code. However, other types of error correcting codes can also be used. In some embodiments, step 1103 comprises adding a Hamming code to each instruction word in the bitstream. In some embodiments, a Hamming code is added to each word, including both instruction words and configuration data words. In some embodiments, e.g., embodiments in which a product code is used, each word to which the product code is applied has the same size, which is the same as a configuration frame size for the PLD. This approach facilitates correction of each configuration data word after the parity word for the coded portion of the bitstream has been received.

As described above, in some embodiments different types of codes are applied to different portions of the bitstream. For example, a high overhead code such as a Hamming code can be applied to instruction words, while a low overhead code such as a product code is applied to configuration data words. Note also that the "mixed mode" or "two tier" error correcting methods described herein can also be applied to data streams other than configuration bitstreams. For virtually any data stream that includes both instruction words and data words, the use of different ECC methods for the instruction words and data words can reduce overall ECC overhead while providing "on the fly" error correction for the instruction words in the transmitted data.

Figure 12:
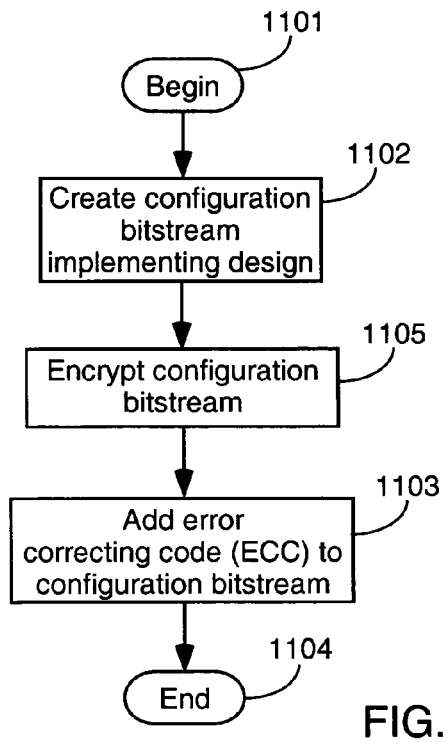
FIGS. 12-13 illustrate variations on the method of FIG. 11.
Figure 13:
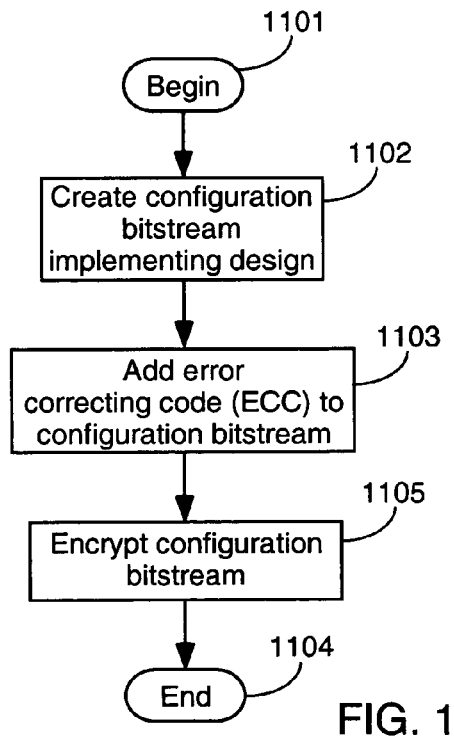

FIGS. 12 and 13 illustrate modifications to the method of FIG. 11 in which an encrypted bitstream is generated. In the method of FIG. 12, the configuration bitstream is encrypted (step 1105) prior to adding the error correcting code in step 1103. Clearly, in this embodiment error correction is performed on the bitstream by the PLD prior to decryption. In the method of FIG. 13, the configuration bitstream is encrypted (step 1105) after adding the error correcting code (step 1103). Clearly, in this embodiment the bitstream is decrypted prior to performing error correction on the bitstream.

Those having skill in the relevant arts of the invention will now perceive various modifications and additions that can be made as a result of the disclosure herein. For example, the above text describes the circuits and methods of the invention in the context of field programmable gate arrays (FPGAs). However, the circuits of the invention can also be implemented in other programmable logic devices (PLDs). Accordingly, all such modifications and additions are deemed to be within the scope of the invention, which is to be limited only by the appended claims and their equivalents.

What is claimed is:

1. A method of detecting and correcting a transmission error in a configuration bitstream for a programmable logic device (PLD), the method comprising:
   receiving the configuration bitstream;
   retrieving first and second error correcting codes from the configuration bitstream;
   changing a value of at least one bit in the configuration bitstream based on each of the first and second error correcting codes, whereby corrected data is generated; and
   configuring the PLD utilizing the corrected data, wherein:
   the configuration bitstream comprises a plurality of bitstream words comprising at least one instruction word and a plurality of configuration data words; and
   the first error correcting code is applied to the instruction word and the second error correcting code is applied to the configuration data words.

2. The method of claim 1, wherein at least one of the first and second error correcting codes is a Hamming code.

3. The method of claim 1, wherein:
   the configuration bitstream comprises a plurality of bitstream words; and
   changing the value of at least one bit in the configuration bitstream comprises changing the value of at least one bit in an erroneous bitstream word prior to receipt of a following bitstream word.

4. The method of claim 3, wherein the plurality of bitstream words comprises at least one instruction word and a plurality of configuration data words, and the erroneous bitstream word comprises an instruction word.

5. The method of claim 3, wherein the plurality of bitstream words comprises at least one instruction word and a plurality of configuration data words, and the erroneous bitstream word comprises a configuration data word.

6. The method of claim 1, wherein:
the configuration bitstream comprises a plurality of bitstream words; and
changing the value of at least one bit in the configuration bitstream comprises changing the value of at least one bit in an erroneous bitstream word after receiving at least one additional bitstream word.

7. The method of claim 1, wherein changing the value of at least one bit in the configuration bitstream occurs after receiving an entirety of the configuration bitstream.

8. The method of claim 1, wherein at least one of the first and second error correcting codes is a product code.

9. The method of claim 1, wherein:
the configuration bitstream comprises a plurality of bitstream words comprising at least one instruction word and a plurality of configuration data words; and
each of the configuration data words has a size equal to a size of a configuration frame for the PLD.

10. The method of claim 1, wherein the first error correcting code is a Hamming code and the second error correcting code is a product code.

11. The method of claim 1, wherein receiving the configuration bitstream comprises receiving an encrypted bitstream, the method further comprising:
decrypting the configuration bitstream after receiving the configuration bitstream and prior to retrieving the first and second error correcting codes.

12. The method of claim 1, wherein receiving the configuration bitstream comprises receiving an encrypted bitstream, the method further comprising:
decrypting the configuration bitstream after the receiving, the retrieving, and the changing and prior to the configuring.

13. The method of claim 1, further comprising:
prior to receiving the configuration bitstream, encrypting the configuration bitstream and transmitting the encrypted configuration bitstream to the PLD; and
after receiving the configuration bitstream, decrypting the configuration bitstream.

* * * * *